United States Patent

Wormser

[15] 3,657,692

[45] Apr. 18, 1972

[54] TRIMMER RESISTOR

[72] Inventor: Hans H. Wormser, New Milford, N.J.

[73] Assignee: Markite Corporation, New York, N.Y.

[22] Filed: Mar. 12, 1971

[21] Appl. No.: 123,609

[52] U.S. Cl. ..............................338/252, 338/195, 338/308, 338/333, 29/610

[51] Int. Cl. ..............................H01c 1/00

[58] Field of Search ..............................338/252, 308, 195, 333; 29/610

[56] References Cited

UNITED STATES PATENTS 3,441,804 4/1969 Klemmer ..............................338/308 X 3,473,146 10/1969 Mulligan ..............................338/308 X

*Primary Examiner*—E. A. Goldberg

*Attorney*—Leonard H. King

[57] ABSTRACT

A variable resistance pad comprising a strip of conductive material which has a channel formed partly therein. Resistive material fills at least a portion of said channel which has a specified shape including a converging section. Electrical terminals are connected to the conductive material on opposite sides of the channel. The resistance may be varied by trimming away portions of the conductive material to decrease the channel length.

20 Claims, 17 Drawing Figures

INVENTOR
HANS K. WORMSER
BY Leonard H. King
ATTORNEY

INVENTOR
HANS E. WORMSER

BY

Leonard H. King
ATTORNEY

TRIMMER RESISTOR

The aforementioned abstract is neither intended to define the invention of the application which, or course, is measured by the claims, nor is it intended to be limiting as to the scope of the invention in any way.

This invention relates to a variable trimmer resistor and more specifically to a resistive pad which can vary in resistance value from zero to a predetermined value.

BACKGROUND OF THE INVENTION

As a result of the modern trend toward miniaturization of electronic components, there has developed a need for a small and inexpensive trimmer resistor which can easily be varied over a very wide range of resistance values. This problem is especially important in adjusting electronic equipment where a resistance must be easily varied until a useful value is obtained, and then this useful value must be permanently fixed to be used in the equipment. A further requirement of many applications of resistance pads is that their resistance value be made variable from substantially zero to a predetermined maximum value.

Accordingly, it is an object of this invention to provide a trimmer resistor which can vary in resistance value from substantially zero to a predetermined maximum value.

A further object of this invention is to provide a trimmer pad which can easily and inexpensively be constructed.

Another object of this invention is to provide a trimmer resistance pad whose resistance can easily be varied in an increasing manner.

A still further object of this invention is to provide a trimmer resistance pad which can be made small and easily manipulated and placed in conjunction with miniature electronic components.

Yet another feature of this invention is to provide a trimmer resistance pad whose resistance value can be varied to a particular useful value and then permanently fixed at this value.

Still a further object of this invention is to provide a trimmer resistance pad whose resistance value varies from zero to a predetermined maximum in accordance with a specified function.

A further object of this invention is to provide a variable resistance trimmer pad which can be rolled or folded to fit into small spaces.

A still further object is to provide a variable trimmer resistor which does not present any discontinuities in the neighborhood of zero resistance.

BRIEF DESCRIPTION OF THE INVENTION

Briefly this invention comprises a portion of highly conductive material partly surrounding a channel in which there is placed resistive material of a specified geometric shape; the combination of the materials forming the resistance pad. Connection to the resistance pad is made from the free ends of the conductive material spaced across the channel. The resistance of the trimmer pad is increased by progressively cutting away sections of the conductive material until no conductive path exists around the channel and then cutting the resistive material progressively proceeding along the channel. To have the resistance begin at zero the geometric shape of the resistive material begins at a point and the area increases along a predetermined geometric shape. The pad may be placed on a substrate and electrical connections may be made to the free ends of the conductive material.

A fuller description of the invention wherein further objects and features may be evident, will hereinafter be described in conjunction with the following figures in which:

DESCRIPTION OF THE DRAWING

Referring now to FIG. 1, there is shown generally at 10, one embodiment of the trimmer resistor in accordance with this invention, comprising a strip 11 of highly conductive material having a channel 12 partly cut out of the strip 11. Resistive material 13 is placed within a portion of the channel 12. The resistive material 13 has a specific geometric shape as shown in FIG. 1 consisting of a shaft portion 14 and an arrowhead 15. The conductive material 11 is shown having an arm 16 extending therefrom at the open end of the channel forming the channel into an L-shape. The conductive material having the resistance portion therein is placed on a substrate 17. At the open end of the conductive material and spaced across the channel are placed terminal connections 18 and 19 and electric lead wires 20 and 21 are connected thereto in the form of "pig tails."

FIG. 7 shows a sectional view of the pad of FIG. 1 taken along line 7—7. As can be seen, the resistive material 15 may lie in the same plane as the highly conductive material 11, both of which are placed on top of the substrate 17.

When electric current is passed through the electrical connections 20 and 21, the current can pass through the highly conductive material and around the resistive material through path 22. The resistance of the trimmer pad will be approximately zero or a very minimal value depending upon the amount off conductivity provided by the material 11.

Figure 1:
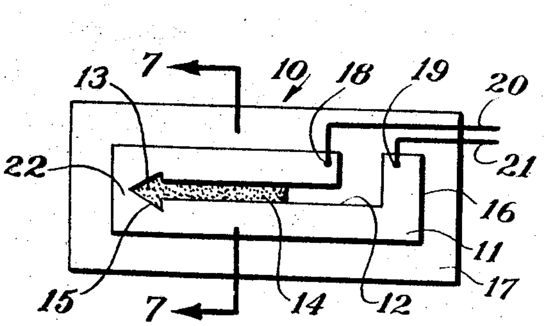
FIG. 1 shows the trimmer resistor in accordance with one embodiment of this invention.
Figure 7:
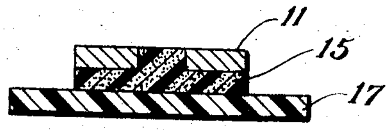
FIG. 7 is a sectional view of the resistance element as shown in FIG. 1 taken along line 7—7.
Figure 2A:
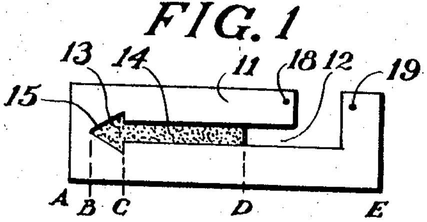
FIGS. 2A, 2B and 2C, show one method of varying the resistance of the trimmer pad in accordance with this invention.
Figure 2B:
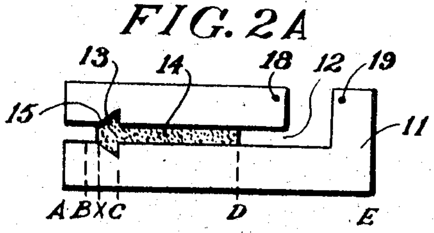
Figure 2C:
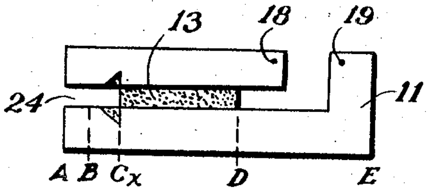

Referring now to FIGS. 2A–2C, it will be shown how to vary the resistance of the trimmer resistor shown in FIG. 1 from a zero value to a fixed design maximum. As shown in FIG. 2, the conductive material 11 extends from point A to point E. The resistive material 15 has its arrowhead extending from point B to point C and its shaft portion from point C to point D. Point B is spaced apart from the end of the conductive material, point A. In FIG. 2A, the resistance between the terminals 18, 19, will be a nominal value of zero. To increase the resistance, a channel is cut out from the conductive material from its end at point A extending into the arrowhead and truncating the triangular shape of the arrowhead.

Referring to FIG. 2B, the channel 23 is seen to extend from the end A of the conductive material into the resistive material, past its tip B and reaching until point X. The resistance of the trimmer pad between the terminals 18, 19, will now be increased as a result of the channel cut which has eliminated the tip of the arrowhead. As the channel is made deeper, and more of the arrowhead is removed, the resistance continues to increase. When the channel cut removes or cuts through the entire arrowhead portion as shown in FIG. 2C, the resistance value of the trimmer pad between terminals 18, 19, will reach a maximum known value which is the design maximum of the trimmer resistor, as determined by its power dissipation capability.

Figure 3A:
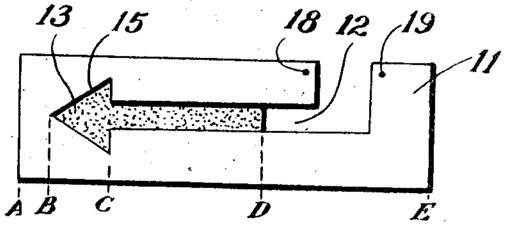
FIGS. 3A, 3B and 3C show a second method of varying the resistance of the trimmer pad in accordance with this invention.
Figure 3B:
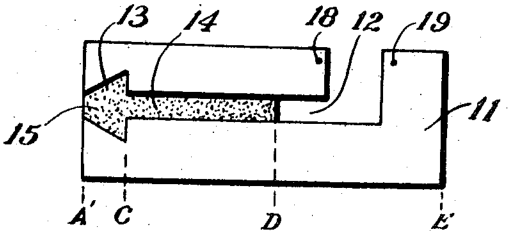
Figure 3C:
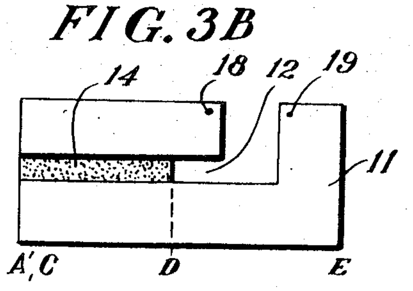

Referring to FIGS. 3A–3C, there is shown a second method of increasing the resistance of the trimmer resistor shown in FIG. 1. In FIG. 3A, the conductive material extends from point A to point E. The arrowhead extends from point B to point C, where point B is located spaced apart from the end, A. The shaft portion extends within the channel 12 form point C to point D. In FIG. 3A, the resistance between terminals 18 and 19 will be a nominal zero since electrons can pass through the conductive material avoiding the resistive material and passing within the section of the conductive material between points A and B. To increase the resistance between terminals 18, 19, the entire front portion of the conductive and resistive material can be trimmed down by means of a scissor or razor thereby shifting the end of the total trimmer pad from point A to point A', as shown in FIG. 3B. By trimming the entire pad, the tip of the resistive material is removed and the triangular shape of the arrowhead is truncated. As more of the trimmer pad is cut off, the resistance between terminals 18 and 19 is increased until the end of the trimmer pad reaches point C, where the entire arrowhead is removed, at which point the fixed value will be reached which is the design maximum of the trimmer pad.

Figure 4:
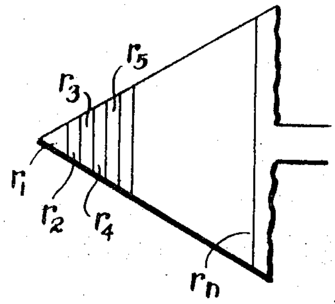
FIGS. 4, 5 and 6 respectively show the conductive material, its equivalent resistance and a graph useful in explaining the theoretical basis for varying the resistance to zero in accordance with this invention.
Figure 5:
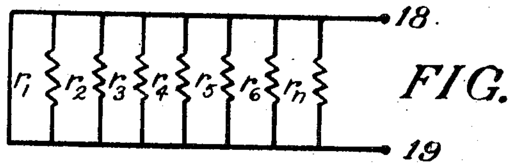
Figure 6:
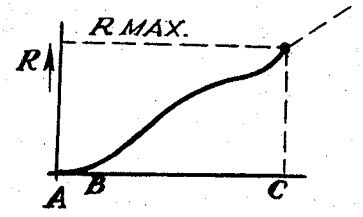

The physical explanation for the increase in resistance between terminals 18 and 19 as resistive material is removed will be explained with reference to FIGS. 4, 5 and 6. As shown in FIG. 4, the resistive material 15 can be represented as a parallel combination of individual resistances each having a unit width and whose resistance is proportional to the length across the arrowhead. These unit resistances are labeled $r_1, r_2 \ldots r_n$. As shown in FIG. 5, the resistances $r_1 \ldots r_n$ are in parallel across the terminals 18, 19. Since the arrowhead is placed within a channel and the conductive material partly surrounds the channel, before any cuts at all have been made into the trimmer pad, the conductive material whose resistance is nominally zero is in parallel with the resistive material 15. This is shown in FIG. 5 by the resistor $r_0$ being in parallel with the individual resistances $r_1 \ldots r_n$ and effectively short circuiting the parallel combination. As the conductive material is removed, $r_o$ is eliminated from the circuit, thereby removing the short circuit path and the resistance will then be the parallel combination of the remaining individual resistances $r_1 \ldots r_n$. Similarly, as the cut is increased and more of the resistive material is removed effectively, more of the resistances $r_1 \ldots r_n$ are removed from the parallel combination and the resistance between terminals 18, and 19, will be the parallel combination of the remaining resistors.

If the resistive material would be rectangular in shape, each of the resistances $r_1 \ldots r_n$ would be of equal value, since the length across the rectangle is uniform. Then, as more of the resistive material is removed, the resistance would increase. However, as the boundary between the conductive material and the resistive material is crossed at right angles to the axis, there would be a discontinuity in the resistance between terminals 18 and 19. Prior to entering into the resistive material, the resistance between points 18 and 19 would be a nominal zero value. However, as soon as the resistance material would be entered, there would be a fixed value of resistance whose value would be the parallel combination of the equal resistances.

By making the geometric shape of the resistance material have its sides converging to a point contact between the conductive and resistive material, as for example an arrowhead, it is possible to minimize the discontinuity at the boundary and have the resistance increase smoothly from zero to the fixed design maximum. The geometric shape of the resistive material as shown in FIG. 1 through FIG. 4 is an arrowhead wherein the sides converge linearly to a point B. The incremental resistance $r_1$ at the tip of the arrowhead would be a minimal value since its length is very small. As the lengths of the adjacent incremental resistances increase, the resistance values of adjacent increments will correspondingly increase. Therefore, $r_1$ will be less than $r_2$ which will be less than $r_n$. Since each of these resistances is in parallel, the combination including the resistance $r_1$ whose resistance is very small will basically be equal to just $r_1$. As the smaller resistances are incrementally removed by cutting away portions from the tip end of the arrowhead, the resistance will increase from zero to a fixed maximum in accordance with a predetermined function. This can be seen in FIG. 6 where the total resistance between terminals 18 and 19 is graphically shown as a function of the distance cut away from point A until point C. From point A to point B the electrons can flow within the conductive material providing an effective short circuit and the nominal resistance is zero. As point B, the tip of the arrowhead is reached, the resistance of the trimmer pad begins increasing from zero until a fixed maximum is reached at point C when the entire arrowhead section is completely cut away or severed.

Figure 13:
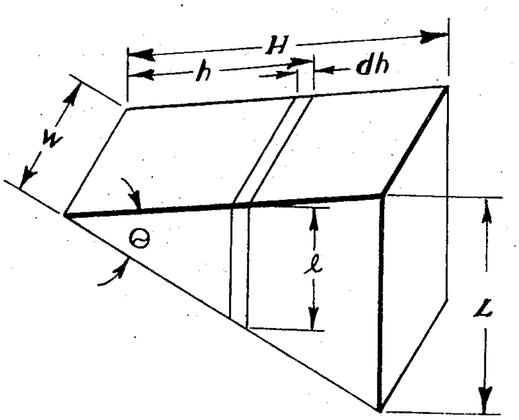
FIG. 13 is a geometric diagram of the head of the resistive material, useful in a mathematical explanation of this invention.

Referring to FIG. 13 a mathematical justification for this invention will be described. In the drawing, there is shown the arrowhead portion of the resistance material wherein the distance across the resistance material is indicated by L, the thickness of the material is given by W, the length along the edge is given by H and the half angle at the apex is given by 0. The conductivity can be given by:

$$G = g \int_{dl}^{dA} \qquad g = \text{conductivity} \tag{1}$$

for an incremental area of the arrowhead, the length across which the electrons flow is given by and the area facing the electrons is W$dh$. Assuming a unit width, the incremental conductivity will be:

$$dG = (g)\,(dh)/l \qquad 2.$$

If the sides of the arrowhead are straight, the values of $l$ and $h$ can be related by the formula:

$$\sin \theta = l/2h \qquad 3.$$

Since the angle $\theta$ is fixed we can rewrite equation (3) as $$l = kh \qquad 4.$$

and equation (2) becomes $$dG = (g/k)\, dh/h = \text{K}\, dh/h \qquad 5$$

To find the total conductance we integrate equation (5) between the limits of $h_1$ a variable value and the maximum H.

$$G = \int dG = K \int_{h_1}^{H} \frac{dh}{h} + G_1 = K \log_e \frac{H}{h_1} + G_1 \tag{6}$$

Where $G_1$ is the conductivity of the shaft, the resistance of the pattern is therefore $$R = \frac{1}{K \log_e \frac{H}{h_1} + G_1} \tag{7}$$

As $h_1$ approaches zero, log $H/h_1$ approaches infinity and the resistance approaches zero. The slope of the resistance change can be further modified by curving the sides of the arrowhead.

It can, therefore, be appreciated that, at the tip of the arrowhead, there will not be a discernible discontinuity as the trimmer pad is cut across the boundary between the conductive and resistive material. The resistance between the trimmer terminals 18, 19, will be variable from zero to a fixed design maximum without any appreciable discontinuities and can, if desired, be made approximately linear with depth of cut $h$.

Figure 8:
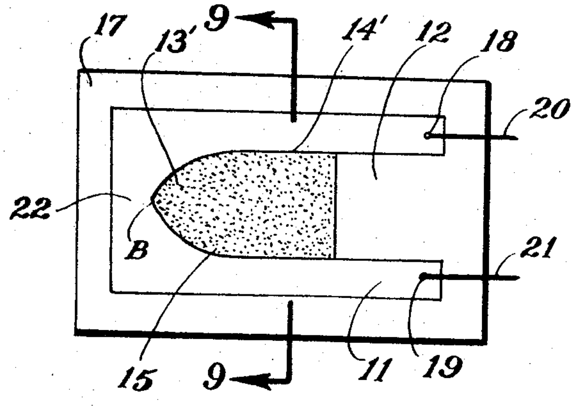
FIG. 8 is a second embodiment of the trimmer resistor in accordance with the principles of this invention.
Figure 9:
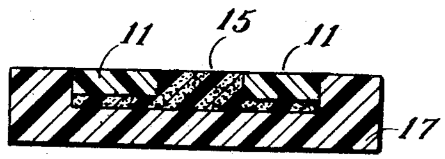
FIG. 9 is a sectional view taken along line 9—9 of FIG. 8.

Referring to FIGS. 8 and 9, there is shown a second embodiment of the trimmer resistor in accordance with this invention wherein like numbers are shown identifying like parts from FIG. 1. As shown, the conductive material 11 has a channel 12 partly cut within it. The channel forms a U within the conductive material and there is no section of conductive material bending the channel into an L shape. The resistive material 15 is shown having a front section 13' whose sides converge to form tip B along a hyperbolic path. The shaft portion 14' is of the same width as the front converging section of the resistive material. As indicated in FIGS. 8 and 9, the resistive material 15 is in the same plane as the conductive material 11. However, both of these are imbedded within the substrate 17 rather than being placed on top of the substrate.

Figure 10:
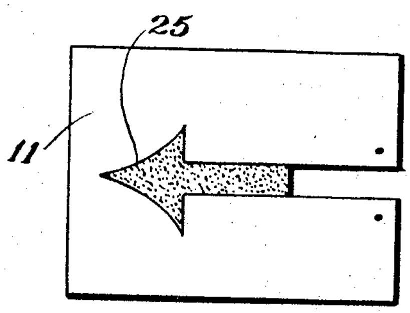
FIGS. 10, 11 and 12 are further embodiments of the resistance pad in accordance with this invention.
Figure 11:
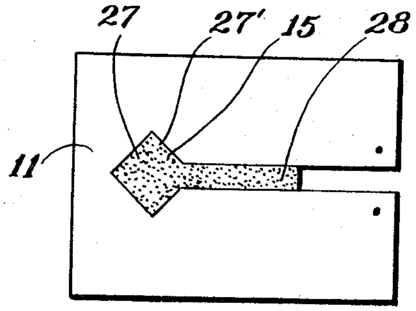

As hereinbefore explained, as long as the geometric shape of the resistive material converges to a point contact between the conductive and resistive material, the resistance value between terminals 18, 19 will be variable to zero without any discontinuities as the boundary is crossed. It is therefore possible to form numerous geometric shapes for the resistive material wherein the variation in resistance between terminals 18, 19 will follow a predetermined function. As shown in FIG. 10, the geometric shape of the resistive material 25 has a front end section comprising converging lines following an exponential path, and a rear portion having a shaft narrower than the maximum thickness of the front end section. In FIG. 11 there is shown a geometric shape of the resistive material having a front end comprised of a combination of a converging and diverging sections 27, 27′ followed by a narrow shaft 28. In this embodiment, the resistance between the end terminals will vary from zero to a fixed maximum at a rate which increases as it approaches the maximum design value.

Figure 12:
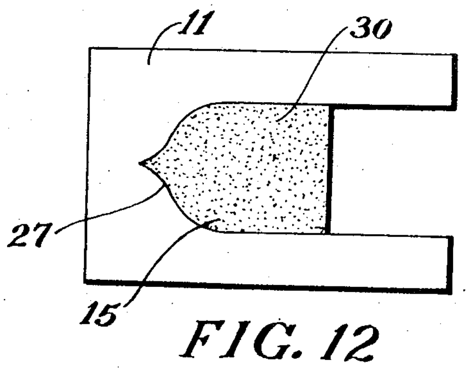

In FIG. 12, there is shown a further embodiment wherein the resistive material has a front section 29 which converges along a predetermined functional value and a rearward section 30, whose width equals the width of the front end section.

It will be appreciated that the portions and functional value of the converging section, and the width and length of the shaft section can be used to determine the relative resistances of the variable to maximum values of the trimmer pad, and the rate of approach to the maximum value.

The conductive material is generally made of extremely high conductivity such as a metal. The resistive portion may be applied to the channel by using conventional thick film resist application technique using a conductive material such as graphite and a resinous binder.

The device can be constructed of any size and specifically can be made very small to fit with miniaturized electronic components. The substrate can be made of flexible materials such as mylar or kapton whereupon once the value desired is determined, the entire pad can be rolled into a coil or folded to reduce its total size even further.

In using the trimmer resistor it is possible to obtain the desired resistance value by merely trimming the edge with a scissor or razor as hereinbefore described until the specific value desired is reached. The entire pad can then be painted over to prevent tampering with the trimmer pad and further inadvertent changes of the desired value.

There has been disclosed heretofore the best embodiment of the invention presently contemplated. However, it is to be understood that various changes and modifications may be made by those skilled in the art without departing from the spirit of the invention.

What I claim as new and desire to secure by Letters Patent is:

1. A variable resistance pad comprising a strip of conductive material having a channel formed partly therein, resistive material filling at least a portion of said channel and having a specified shape including a converging section, and electrical terminals respectively connected to said conductive material on opposite sides of said channel.

2. A variable resistance pad as in claim 1, wherein said conductive material presents a path around said channel for electron flow between said terminals.

3. A variable resistance pad as in claim 1 wherein said conductive material with said resistive material therein is connected to an insulating substrate.

4. A variable resistance pad as in claim 1 wherein the shape of said channel conforms to the shape of said resistive material.

5. A variable resistance pad as in claim 1 wherein said shape includes a forward part having said converging section and a rearward part extending from said forward part.

6. A variable resistance pad as in claim 5 wherein said forward section is shaped in the form of an arrowhead and said rearward section is shaped in the form of a shaft.

7. A variable resistance pad as in claim 1 wherein said converging section has sides which converge according to a given functional relationship.

8. A variable resistance pad as in claim 1 wherein said converging section has sides which are convex shaped.

9. A variable resistance pad as in claim 1 wherein said converging section has sides which are concave shaped.

10. A variable resistance pad as in claim 1 wherein said conductive and resistive material is bonded onto the surface of said substrate.

11. A variable resistance pad as in claim 1 wherein said conductive and resistive material is imbedded within said substrate.

12. A variable resistance pad as in claim 1 wherein said substrate is flexible.

13. A variable resistance pad as in claim 1 further including wires electrically connected to said terminals.

14. A variable resistance pad comprising a strip of highly conductive material having a channel formed partly therein, said channel being in the shape of an arrowhead and shaft, a resistive material completely filling said arrowhead shape and a portion of the length of the shaft shape and a substrate, said conductive and resistive material being attached to said substrate.

15. A variable resistance pad as in claim 14 further including electrical terminals connected to the ends of said conductive material at opposite sides of said channel shape.

16. A variable resistance pad as in claim 14 wherein said pad is of material which can be trimmed by cutting off successive sections of said pad.

17. In a variable resistance pad having a strip of conductive material including a channel formed partly therein, resistive material filling at least a portion of said channel and having a specified shape including a converging section, the method of varying the resistance thereof including the steps of cutting the conductive material into two sections, each on opposite sides of the channel, and successively removing sections of the resistive material.

18. The method of claim 17 wherein said step of removing is achieved by trimming the pad.

19. The method of claim 17 wherein said step of removing is achieved by cutting a channel into the end of said pad containing the resistive material.

20. The method of claim 17 further comprising the steps of completely coating said pad with insulating material after a desired value of resistance is achieved.

* * * * *